US006992348B2

(12) United States Patent
Kleint et al.

(10) Patent No.: US 6,992,348 B2
(45) Date of Patent: Jan. 31, 2006

(54) SEMICONDUCTOR MEMORY WITH VERTICAL CHARGE-TRAPPING MEMORY CELLS AND FABRICATION

(75) Inventors: Christoph Kleint, Dresden (DE); Joachim Deppe, Dresden (DE); Christoph Ludwig, Langebruck (DE); Jens-Uwe Sachse, Dresden (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 10/741,970

(22) Filed: Dec. 19, 2003

(65) Prior Publication Data

US 2004/0164345 A1 Aug. 26, 2004

(30) Foreign Application Priority Data

Dec. 20, 2002 (DE) ................. 102 60 185

(51) Int. Cl.
*H01L 29/792* (2006.01)
(52) U.S. Cl. .................. 257/324; 257/74; 257/296; 257/329; 257/330; 438/239; 438/212; 438/259; 438/270
(58) Field of Classification Search ............. 257/74, 257/296, 329, 330; 438/212, 239, 259, 270
See application file for complete search history.

(56) References Cited

U.S. PATENT DOCUMENTS

| 5,763,310 | A | 6/1998 | Gardner |
| 5,966,603 | A | 10/1999 | Eitan |
| 6,239,465 | B1 | 5/2001 | Nakagawa |
| 6,486,028 | B1 | 11/2002 | Chang et al. |
| 6,583,479 | B1 | 6/2003 | Fastow et al. |
| 6,881,994 | B2 * | 4/2005 | Lee et al. ................. 257/296 |
| 2002/0024092 | A1 | 2/2002 | Palm et al. |

FOREIGN PATENT DOCUMENTS

| DE | 100 39 441 A1 | 2/2002 |
| EP | 0 967 654 A1 | 12/1999 |

* cited by examiner

*Primary Examiner*—Mai-Huong Tran
(74) *Attorney, Agent, or Firm*—Slater & Matsil, L.L.P.

(57) ABSTRACT

Outside a memory cell field, bit-line contacts are provided on the top bit lines and additional bit-line contacts are provided on the lower bit lines and are each connected in an electrically conductive way to a metallization layer provided for wiring. The bit-line contacts for the upper bit lines and the additional bit-line contacts for the lower bit lines are formed on opposite sides of the memory cell field and portions of the isolation trenches are present between the additional bit-line contacts.

17 Claims, 8 Drawing Sheets

SEMICONDUCTOR MEMORY WITH VERTICAL CHARGE-TRAPPING MEMORY CELLS AND FABRICATION

TECHNICAL FIELD

The present invention relates generally to semiconductor devices and, more particularly, to a semiconductor memory with vertical charge-trapping memory cells and a method of fabricating the same.

BACKGROUND

For further miniaturization of charge-trapping memory cells, especially of NROM (nitride read only memory) memory cells, memory transistors can be arranged on the walls of trenches etched into a semiconductor material. This arrangement significantly reduces the strong dependence of the necessary chip surface area on the thickness of the gate oxide and the channel length of the transistors, as is typical for two-dimensional components. One such semiconductor memory with vertical charge-trapping memory cells consists of a comb-like structure of the semiconductor body or substrate with channel regions in the trench walls. The channel regions are located between source/drain regions that are located at the surface on the edge of the trenches and at the base of the trenches.

Here, it is difficult to connect the bit line in the trench base. A connection must contact the bit line in the trench base and connect vertically to one of the metallization layers provided for wiring. Within the cell field, the trench for such a contact is too narrow.

SUMMARY OF THE INVENTION

In one aspect, the present invention discloses a layout for a semiconductor memory with vertical charge-trapping memory cells, which enables economical contacting of the bit lines at the trench base.

For the semiconductor memory of one embodiment, a comb-like structure is formed on a top side of a semiconductor body or substrate, in which parallel trenches are arranged at intervals to each other. These trenches are alternately isolation trenches and active trenches, wherein the isolation trenches are arranged between the lower bit lines on the trench bases and the active trenches are provided for the memory transistors. Outside a memory cell field, bit-line contacts are present on the top bit lines and additional bit-line contacts are present on the lower bit lines and are each connected in an electrically conductive way to a metallization layer provided for wiring. Further, the bit-line contacts for the upper bit lines and the additional bit-line contacts for the lower bit lines are mounted on opposing sides of the memory cell field and portions of the isolation trenches are arranged between the additional bit-line contacts.

These isolation trenches can be generated together with the isolation trenches in the core and in the periphery of the memory chip. This is performed in a known way like the method of STI (shallow trench isolation). During fabrication, lithography masks are used for structuring the isolation trenches and the active trenches and also for structuring the regions provided for the bit-line contacts. The STI trenches in the core and in the periphery of the chip are generated simultaneously.

Nitride read only memory (NROM) devices are disclosed in a number of prior art references. For example, U.S. Pat. No. 5,966,603 ('603) teaches a method of fabricating a NROM chip. U.S. Pat. No. 6,583,479 ('479) discloses a non-volatile read only memory transistor that includes a substantially vertically oriented channel fabricated in a trench formed in a substrate. The '603 and '479 patents are incorporated herein by reference.

U.S. Pat. No. 6,486,028, which is incorporated herein by reference, discloses a method for fabricating a nitride read only device. A trench is formed in a semiconductor substrate. An ion implantation is performed to form a first source/drain region and a second source/drain region within the substrate in the upper corners of the trench, and to form a common source/drain region within the substrate at a bottom of the trench. Next, a trapping layer is formed over the substrate and the trench and a gate conducting layer is formed over the substrate and filling the trench.

BRIEF DESCRIPTION OF THE DRAWINGS

In the following, a more detailed description of examples of the semiconductor memory and the fabrication method is given with reference to FIGS. 1–12.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
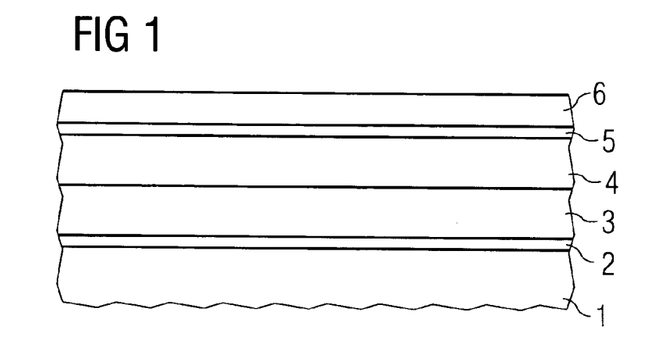
FIG. 1 shows a first intermediate product in cross section.

In FIG. 1, a semiconductor body 1, e.g., a substrate, is shown in cross section with a pad oxide layer 2 deposited on this body, a pad nitride layer 3 deposited on the oxide layer 2, a hard mask layer 4 deposited on the nitride layer 3, an anti-reflex layer 5 (e.g., anti-reflection coating or ARC layer) deposited on this mask layer 4, and a photoresist layer 6 deposited on the anti-reflex layer 5. The material of the hard mask layer 4 is, e.g., an oxide deposited by the decomposition of TEOS (tetraethylorthosilicate). The anti-reflex layer 5 is used to simplify the subsequent photolithography.

Figure 2:
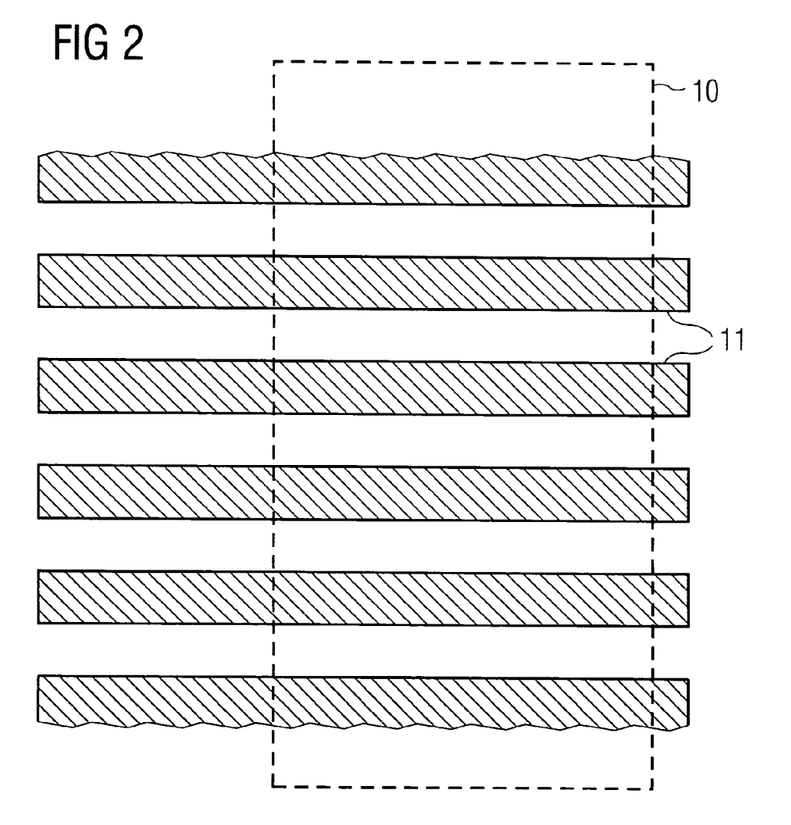
FIG. 2 shows the structure of a first lithography mask in a top view.

This lithography is performed by means of a first lithography mask 11, which is shown schematically in FIG. 2 in a top view and which has the structure indicated in FIG. 2 so that a photoresist mask produced with this method covers the cross-hatched regions. The cross-hatched regions extend at the sides beyond the provided memory cell field 10. Therefore, with this first lithography mask 11, strip-like regions in the area of the memory cell field and also large surface-area regions at the periphery are removed by the photoresist layer 6. According to whether a positive or a negative photoresist is used, i.e., whether the illuminated portions are to be removed or preserved, the first lithography mask 11 has openings in the cross-hatched regions or a complementary structure.

Figure 3:
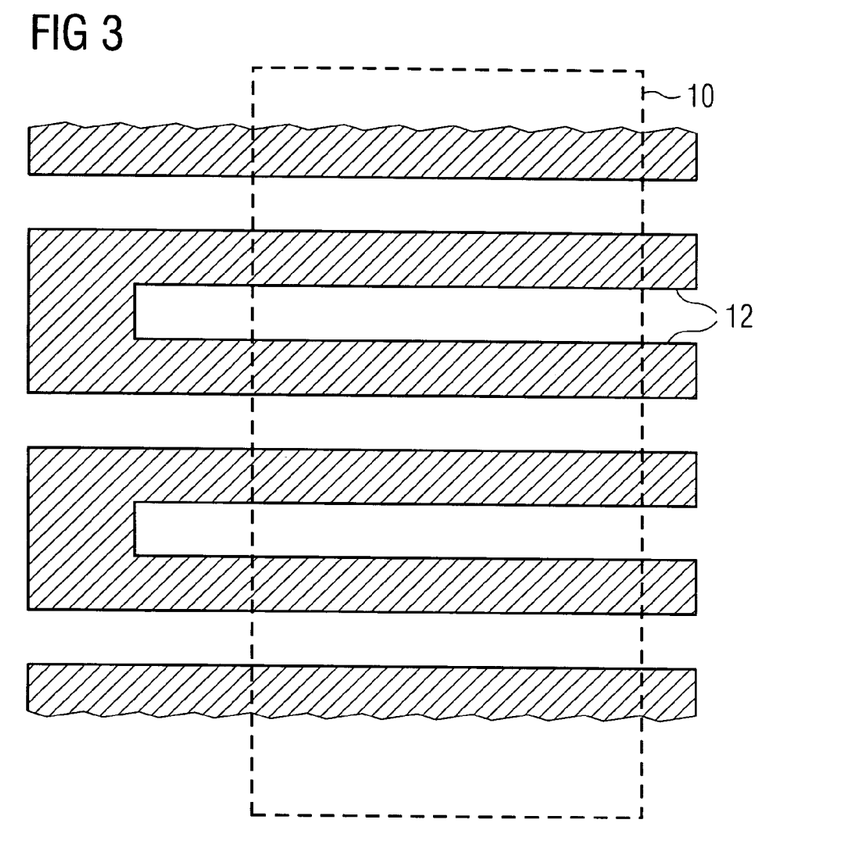
FIG. 3 shows an alternative example of the first lithography mask in a top view.

FIG. 3 shows an alternative configuration of the first lithography mask 12, for which the cross-hatched regions, which are covered by the produced photoresist layer, are combined in pairs outside the memory cell field 10. This configuration is especially suitable for the fabrication of flash memory cells.

Figure 4:
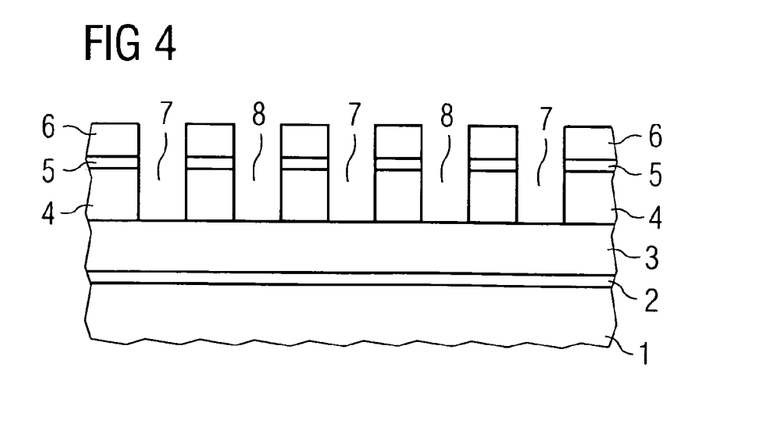
FIG. 4 shows a second intermediate product in cross section.
Figure 6:
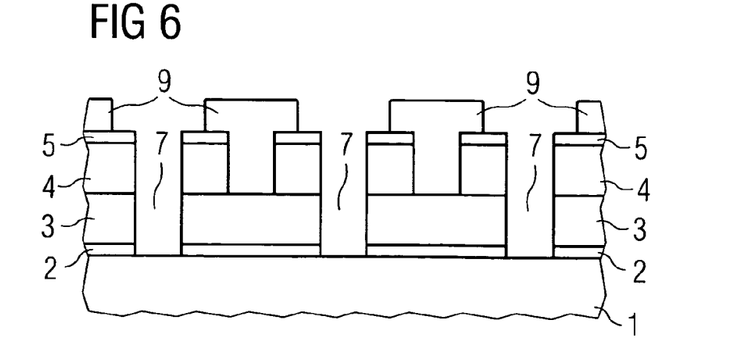
FIG. 6 shows a third intermediate product in cross section.

FIG. 4 shows in cross section how the structured photoresist layer 6 is used to etch parallel, strip-like openings arranged at intervals to each other in the anti-reflex layer 5 and the hard mask layer 4. Here, openings for isolation trenches 7 and openings for active trenches 8 are provided. Here, the term "active trench" means that the relevant trench is provided for the arrangement of vertical memory transistors. As illustrated in FIG. 6, the photoresist layer 6 is then removed. The anti-reflex layer 5 can also be removed at this time. Then another photoresist layer 9 is deposited, wherein, if necessary, the anti-reflex layer 5 is renewed.

Figure 5:
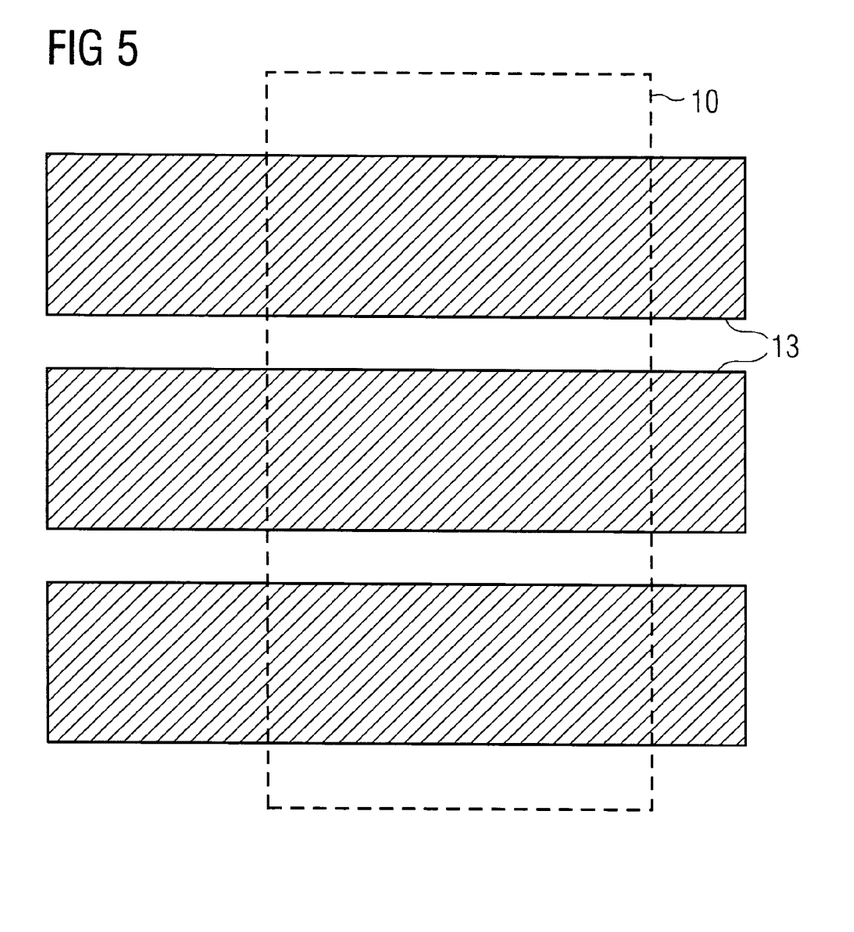
FIG. 5 shows the structure of a second lithography mask in a top view.

The second lithography mask 13 corresponding to the top view of FIG. 5 is then used to structure the other photoresist layer so that the regions that are cross-hatched in FIG. 5 are covered. As can be seen here with reference to the borders of the memory cell field 10 drawn for orientation, this second lithography mask 13 is provided for the purpose of structuring the other photoresist layer so that only the already produced openings, which are provided for the isolation trenches 7, are exposed. Here, the mask also covers in particular the connection regions for the bit lines in the active trenches.

FIG. 6 shows this other intermediate product in cross section. The other photoresist layer 9 now still has only strip-like portions, which close the openings for the active trenches 8 and expose the openings for the isolation trenches 7. The pad nitride layer 3 and the pad oxide layer 2, and, if necessary, also a portion farther into the semiconductor body 1 or the substrate, are then etched in these openings. Here, the structured hard mask layer 4 is likewise used as a mask. Then the other photoresist layer 9 is removed.

Figure 7:
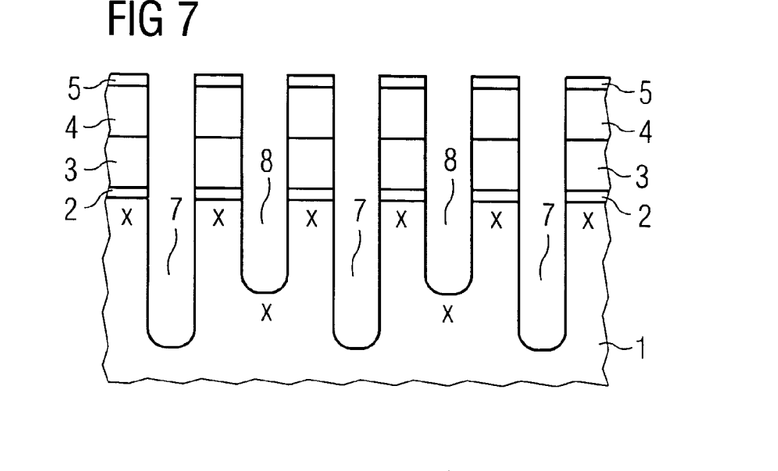
FIG. 7 shows a fourth intermediate product in cross section.

FIG. 7 shows the cross section of an intermediate product after another etching step, in which the pad nitride layer 3 and the pad oxide layer 2 are also etched in the openings, which are provided for the active trenches 8. In the remaining openings for the isolation trenches 7, semiconductor material of the semiconductor body 1 (e.g., substrate) is also already removed. This etching step continues into the semiconductor material 1 until the structure of FIG. 7 is produced. The deeper trenches manufactured in this way are provided for the isolation trenches 7, while the flatter trenches are provided as active trenches 8 and the flat region adjacent to the flat trenches is provided as a contact region for contacting the bit lines in the active trenches. The trenches can then be filled with a high-temperature oxide (e.g., high density plasma or HDP oxide), which is made level with the surface, e.g., by means of CMP (chemical-mechanical polish). Another photoresist layer is then deposited.

Figure 8:
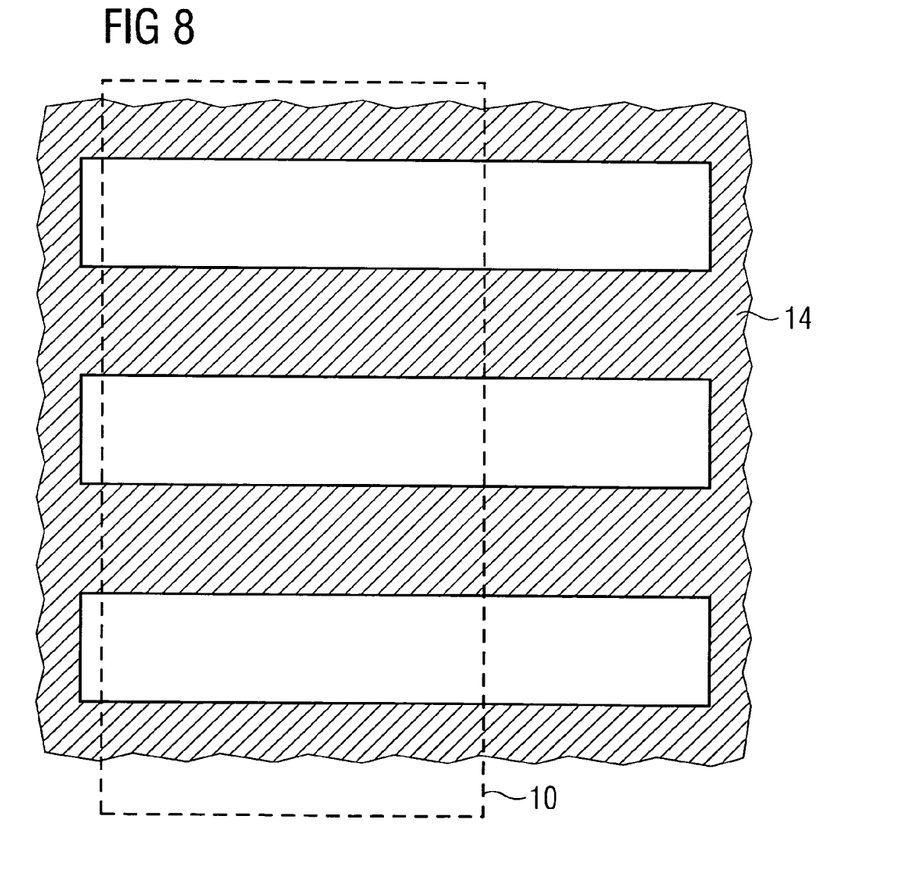
FIG. 8 shows the structure of a third lithography mask in a top view.

By means of a third lithography mask 14, which is shown in a top view in FIG. 8, the other photoresist layer is structured so that the regions that are cross-hatched in FIG. 8 remain covered. Under the use of this structured additional photoresist layer, the oxide in the active trenches 8 is then removed. From the position of the memory cell field 10 marked in FIG. 8, it can be seen that the openings of this photoresist mask extend beyond the memory cell field on the right side in FIG. 8 and there the openings have a width, with which sufficiently wide recesses can be etched for later attachment of the bit-line contacts.

Figure 9:
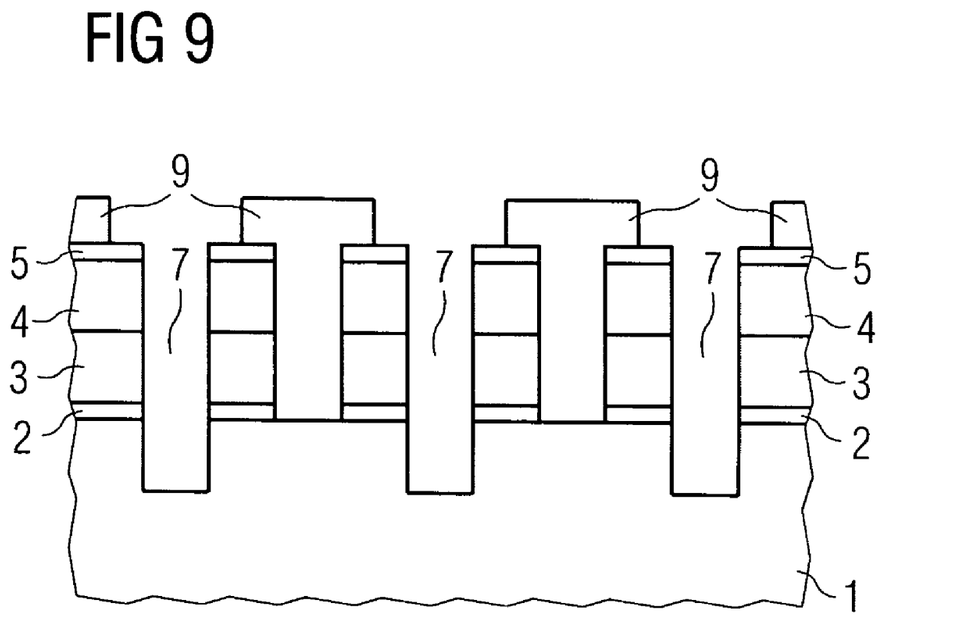
FIG. 9 shows the intermediate product from FIG. 6 for an alternative configuration of the method in cross section.

FIG. 9 shows in cross section an intermediate product of an alternative method, in which the hard mask layer 4, the pad nitride layer 3 and the pad oxide layer 2 are already structured. Under the use of the additional photoresist layer 9 structured with the second lithography mask 13, the openings, which are provided for the isolation trenches 7, are already etched into the semiconductor material of the semiconductor body 1 or substrate. In additional processing steps, in principle the same structure as shown in FIG. 7 is obtained.

Then impurities are implanted in order to form source/drain regions on the surface at the sides of the active trenches 8 and at the bases of the active trenches 8 by introducing dopants, whose positions are marked in FIG. 7 with X's. Vertical memory transistors are formed in the active trenches 8. These memory transistors each have on one wall of an active trench 8 a channel region, which is separated from a gate electrode arranged in the trench by a gate dielectric. Such a channel region is defined by the doped regions of source and drain, which are adjacent to the trench at the floor of the associated trench and the surface of the semiconductor body.

At least between the gate electrode and a source-side or drain-side end of an associated channel region, there is a dielectric memory layer sequence made from a first limiting layer, a memory layer, and a second limiting layer, especially an oxide-nitride-oxide layer sequence, which is provided for programming the memory cell by trapping hot electrons from the channel region (channel hot electrons or CHE). The source/drain regions on the surface of the semiconductor body or substrate are each connected to each other between two trenches 7, 8 adjacent to each other by upper bit lines running parallel to the trenches, while the source/drain regions on the bases of the trenches are connected to each other along the same trench by lower bit lines formed (buried) as doped regions running in the semiconductor body or substrate.

Figure 10:
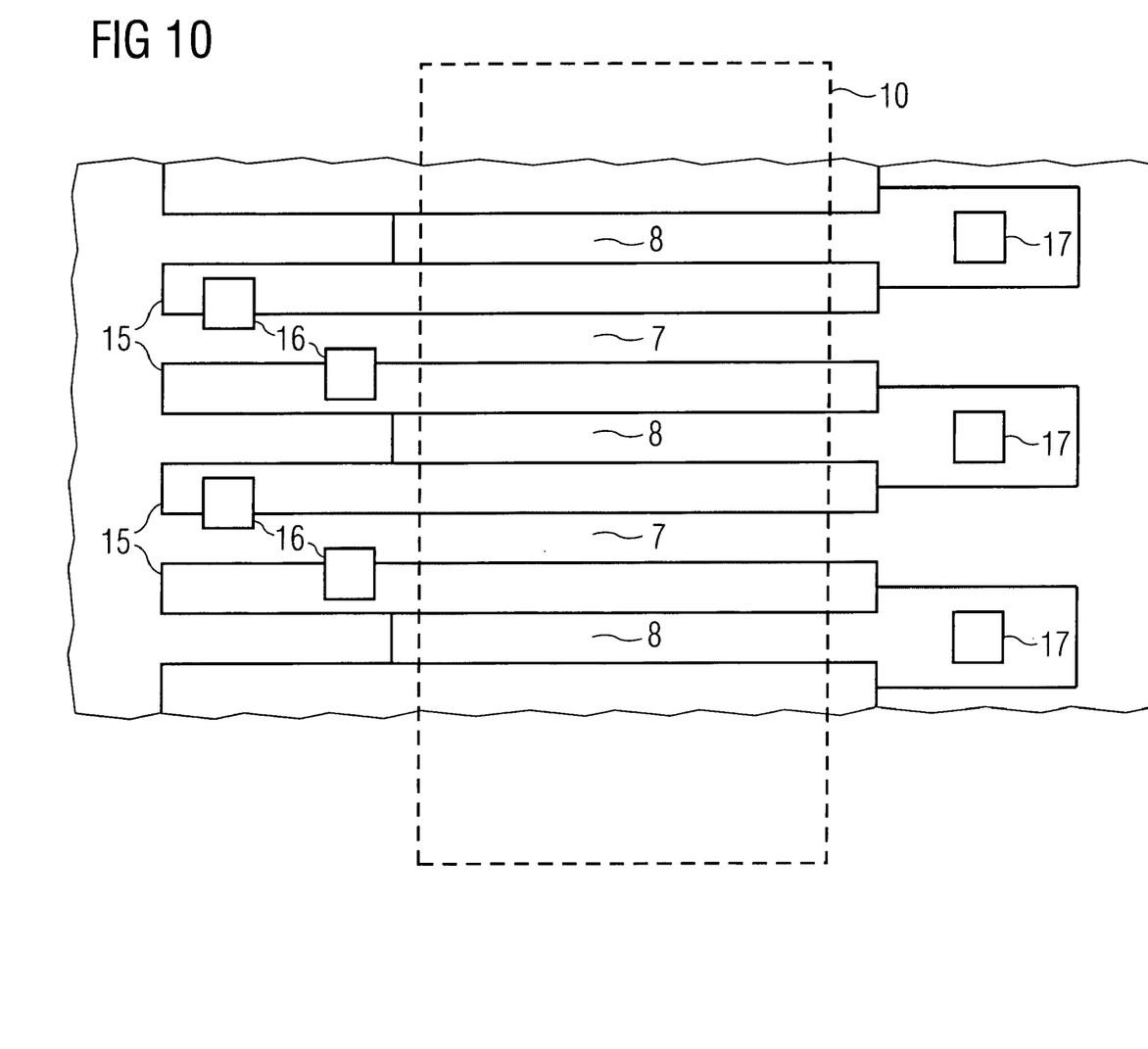
FIG. 10 shows a schematic of a first embodiment of the memory chip in a top view.

FIG. 10 shows a layout of such a memory chip in a top view. Here, the isolation trenches 7 and the active trenches 8 are in an alternating arrangement. In-between, there are the comb-like structures of the semiconductor body or substrate, which form on the surface the upper bit lines 15. On the upper bit lines 15, bit-line contacts 16 are deposited on one side of the memory cell field 10, with which the upper bit lines 15 are connected in an electrically conductive way to one of the metallization layers of the surface wiring. In the example shown in FIG. 10, separate bit-line contacts 16 for forming EEPROM memory cells are provided for all upper bit lines 15.

The lower bit lines in the active trenches 8 are contacted with additional bit-line contacts 17 on the opposite side next to the memory cell field 10 and connected in an electrically conductive way to a metallization layer, wherein, for the additional bit-line contacts 17, wider recesses are provided here than corresponds to the width of the active trenches. These wide recesses between the material of the isolation trenches 7 are fabricated under the use of the third lithographic mask 14 from FIG. 8.

Figure 11:
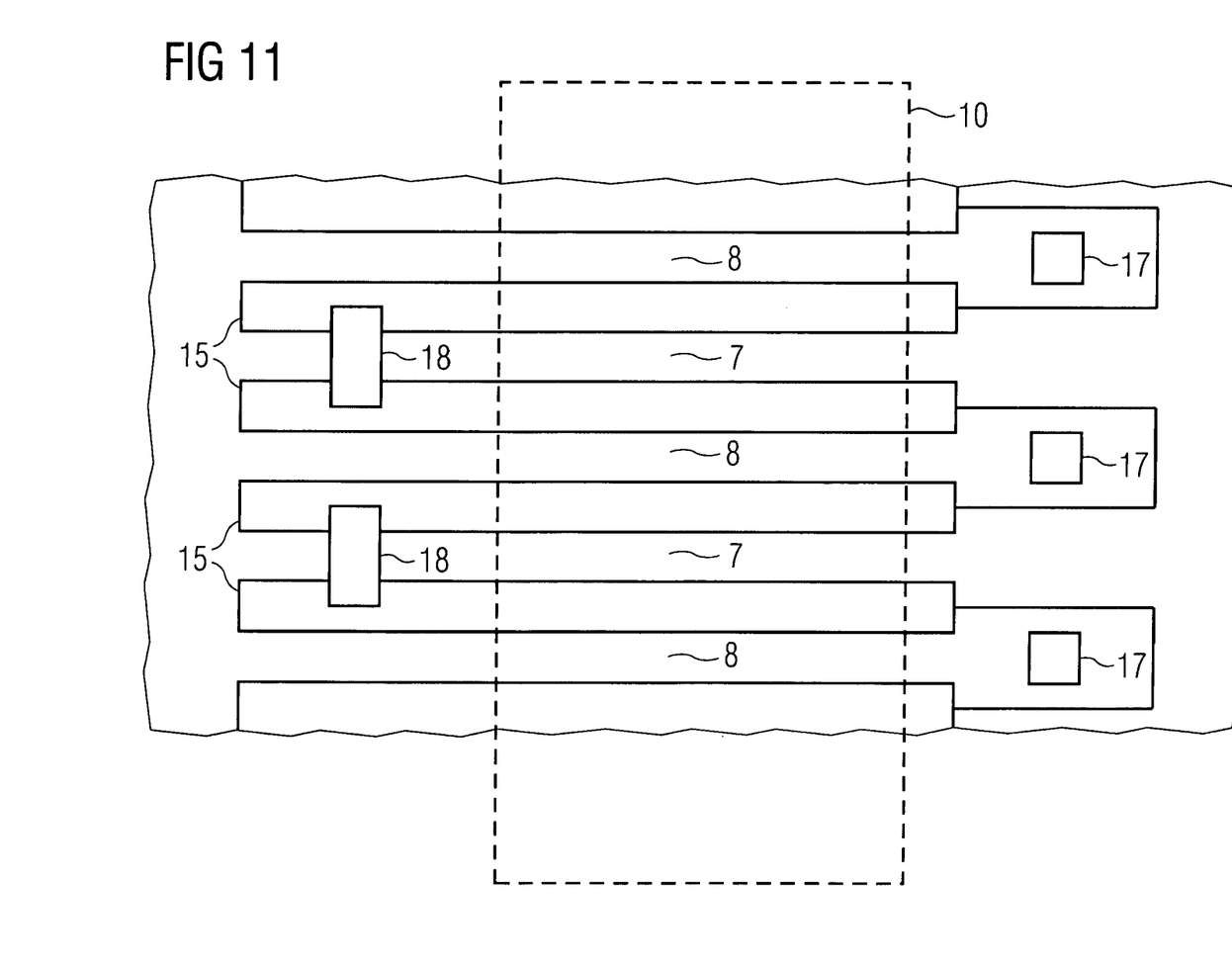
FIG. 11 shows a schematic of a second embodiment of the memory chip in a top view.

FIG. 11 shows another layout of the memory chip in a top view corresponding to FIG. 10. Here, the bit-line contacts 18 are deposited so that every two adjacent upper bit lines, which are separated from each other by an isolation trench 7, have a common bit-line contact 18.

Figure 12:
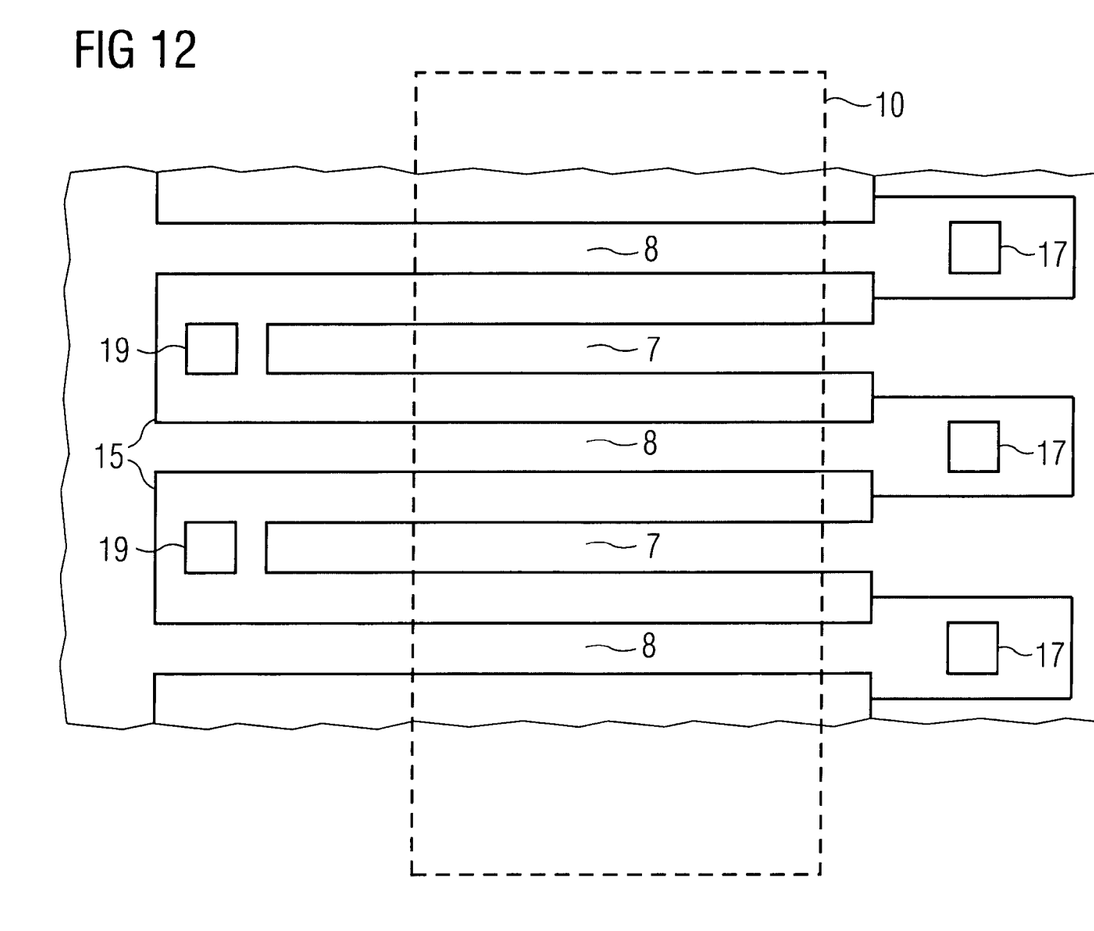
FIG. 12 shows a schematic of a third embodiment of the memory chip in a top view.

FIG. 12 shows a third embodiment of the layout, corresponding to FIG. 10 in a top view, for which every two adjacent upper bit lines 15, which are separated from each other by an isolation trench 7, have a cross connection outside the memory cell field 10 in the semiconductor material. The bit-line contact 19 can thus be deposited in the shown way on this cross connection.

The fabrication of STI isolation trenches for the core and periphery can be combined with the fabrication process for the isolation trenches 7. For this purpose, the lithography masks are designed accordingly. The second lithography mask can be open or closed at the positions provided for the STI trenches of the core and periphery, so that the trenches produced at the periphery are etched more or less deeply. Less deep trenches have the advantage that the process for making the oxide planar is simplified. If deeper isolation trenches are fabricated at the periphery, a thicker oxide layer may also be deposited there in order to fill the trenches with oxide. This is because the trenches provided for the core and periphery are typically significantly wider than the isolation trenches of the memory cell field.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor memory device with vertical charge-trapping memory cells, the device comprising:
    a semiconductor body;
    a plurality of parallel openings arranged at intervals to each other in the semiconductor body, wherein the openings alternate between active trenches and isolation trenches;
    a plurality of memory cells located in a memory cell field, each memory cell being disposed in one of the active trenches, each of the memory cells including:
        a first source/drain region disposed in a top surface of the semiconductor body adjacent the trench;
        a second source/drain region disposed in the semiconductor body at a floor of the trench;
        a channel region disposed along a sidewall of the active trench, wherein the channel region is disposed between the first source/drain region and the second source/drain region;
        a gate electrode;
        a gate dielectric, wherein the gate dielectric separates the channel region from the gate electrode;
        a charge trapping region disposed between the gate electrode and a portion of the channel region, wherein the charge trapping region is provided for programming by trapping charge from the semiconductor body;
    a plurality of upper bit lines electrically coupling the first source/drain regions of a plurality of the memory cells to each other;
    a plurality of lower bit lines electrically coupling the second source/drain regions of a plurality of the memory cells to each other;
    a plurality of upper bitline contacts, each upper bitline contact electrically coupled to at least one of the upper bit lines at a location outside the memory cell field; and
    a plurality of lower bitline contacts, each lower bitline contact electrically coupled to at least one of the lower bit lines.

2. The device of claim 1 wherein the charge trapping region comprises a dielectric memory layer sequence.

3. The device of claim 2 wherein the dielectric memory layer sequence comprises a memory layer disposed between a first limiting layer and a second limiting layer.

4. The device of claim 3 wherein the memory layer comprises a nitride layer and wherein the first and second limiting layers comprise oxide layers.

5. The device of claim 3 wherein the dielectric memory layer sequence is provided for programming by trapping hot electrons from the channel region.

6. The device of claim 1 wherein the charge trapping region is provided for programming by trapping hot electrons from the channel region.

7. The device of claim 1 wherein the upper bit lines run parallel to the parallel openings.

8. The device of claim 7 wherein the lower bit lines run along the same active trenches as the upper bit lines.

9. The device of claim 1 wherein the lower bit-line contacts are electrically coupled to a metallization layer provided for wiring.

10. The device of claim 1 wherein each upper bitline contact is electrically coupled to at least one of the upper bit lines at a location outside the memory cell field.

11. The device of claim 10 wherein the upper bitline contacts and the lower bitline contacts are disposed on opposite sides of the memory cell field, and wherein portions of the isolation trenches are arranged between the lower bit-line contacts.

12. The device of claim 1 wherein the semiconductor body comprises a semiconductor substrate.

13. The device of claim 1 wherein the lower bit lines comprise doped regions in the semiconductor body.

14. The device of claim 13 wherein the isolation trenches are present between the lower bit lines.

15. The device of claim 1 wherein each upper bitline contact contacts only one upper bit line.

16. The device of claim 1 wherein each upper bitline contact contacts two adjacent upper bit lines, wherein the two adjacent upper bit lines are separated by an isolation trench.

17. The device of claim 16 wherein the two adjacent upper bit lines have a cross-connection outside of the memory cell field in semiconductor material of the semiconductor body.

* * * * *